(12) United States Patent
Tomura et al.

(10) Patent No.: US 9,972,503 B2
(45) Date of Patent: May 15, 2018

(54) ETCHING METHOD

(71) Applicant: TOKYO ELECTRON LIMITED, Tokyo (JP)

(72) Inventors: Maju Tomura, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days. days.

(21) Appl. No.: 15/809,129

(22) Filed: Nov. 10, 2017

(65) Prior Publication Data

US 2018/0068865 A1 Mar. 8, 2018

Related U.S. Application Data

(63) Continuation of application No. 14/813,353, filed on Jul. 30, 2015, now Pat. No. 9,837,285.

(30) Foreign Application Priority Data

Aug. 28, 2014 (JP) ................. 2014-174004

(51) Int. Cl.
*H01L 21/31* (2006.01)
*H01L 21/30* (2006.01)
*H01L 21/311* (2006.01)
*H01L 21/768* (2006.01)

(52) U.S. Cl.
CPC .. *H01L 21/31144* (2013.01); *H01L 21/31116* (2013.01); *H01L 21/76897* (2013.01)

(58) Field of Classification Search
CPC ......... H01L 21/31; H01L 21/07; H01L 21/30; H01L 21/00

USPC .................. 438/700–702, 723, 10, 714, 710; 156/345.33, 345.29, 345.39, 345.46
See application file for complete search history.

(56) References Cited

U.S. PATENT DOCUMENTS

| 4,985,114 A | 1/1991 | Okudaira et al. |
| 5,503,901 A | 4/1996 | Sakai et al. |
| 5,723,386 A * | 3/1998 | Ishikawa ............... C23C 16/402 |
| | | 257/E21.278 |
| 6,215,087 B1 | 4/2001 | Akahori et al. |
| 6,221,784 B1 | 4/2001 | Schmidt et al. |
| 6,423,242 B1 | 7/2002 | Kojima et al. |
| 7,514,375 B1 | 4/2009 | Shanker et al. |
| 7,708,859 B2 | 5/2010 | Huang et al. |
| 2002/0069971 A1 | 6/2002 | Kaji et al. |
| 2004/0124177 A1* | 7/2004 | Urban ................. B81C 1/00579 |
| | | 216/67 |
| 2004/0173571 A1* | 9/2004 | Laermer ........... H01J 37/32137 |
| | | 216/67 |

(Continued)

*Primary Examiner* — Sheikh Maruf
(74) *Attorney, Agent, or Firm* — Rothwell, Figg, Ernst & Manbeck, P.C.

(57) ABSTRACT

A method for selectively etching a first region of silicon oxide with respect to a second region of silicon nitride includes a first step of exposing a target object having the first region and the second region to a plasma of a processing gas containing a fluorocarbon gas, etching the first region, and forming a deposit containing fluorocarbon on the first region and the second region. The method further includes a second step of etching the first region by a radical of the fluorocarbon contained in the deposit. In the first step, the plasma is generated by a high frequency power supplied in a pulsed manner. Further, the first step and the second step are repeated alternately.

16 Claims, 7 Drawing Sheets

(56) References Cited

U.S. PATENT DOCUMENTS

| | | | |
|---|---|---|---|
| 2004/0214451 A1* | 10/2004 | Johnson | C23C 16/401 438/788 |
| 2005/0047889 A1 | 3/2005 | Lee | |
| 2005/0054153 A1 | 3/2005 | Asami et al. | |
| 2005/0241763 A1 | 11/2005 | Huang et al. | |
| 2006/0154472 A1 | 7/2006 | Kikuchi et al. | |
| 2006/0154477 A1* | 7/2006 | Geng | H01L 21/0337 438/637 |
| 2007/0221493 A1 | 9/2007 | Honda et al. | |
| 2007/0228002 A1* | 10/2007 | Geng | H01L 21/0337 216/37 |
| 2007/0284246 A1 | 12/2007 | Keil et al. | |
| 2008/0085604 A1 | 4/2008 | Hoshino et al. | |
| 2008/0110859 A1* | 5/2008 | Koshiishi | H01J 37/32027 216/67 |
| 2008/0188082 A1* | 8/2008 | Chi | H01L 21/31116 438/700 |
| 2010/0190350 A1 | 7/2010 | Yatsuda et al. | |
| 2010/0216260 A1 | 8/2010 | Takahashi | |
| 2011/0217851 A1* | 9/2011 | Liang | C23C 16/345 438/786 |
| 2012/0028454 A1* | 2/2012 | Swaminathan | C23C 16/045 438/558 |
| 2012/0052689 A1* | 3/2012 | Tokashiki | H01J 37/32091 438/714 |
| 2012/0094468 A1* | 4/2012 | Bhatia | H01L 21/02126 438/437 |
| 2013/0072007 A1* | 3/2013 | Xia | C30B 29/06 438/513 |
| 2014/0148016 A1 | 5/2014 | Kanazawa et al. | |
| 2015/0243521 A1 | 8/2015 | Ogawa et al. | |
| 2015/0279624 A1 | 10/2015 | Toyota et al. | |
| 2015/0371830 A1 | 12/2015 | Takahashi et al. | |

* cited by examiner

ETCHING METHOD

CROSS-REFERENCE TO RELATED APPLICATIONS

This application is a continuation of U.S. patent application Ser. No. 14/813,353, filed Jul. 30, 2015, and claims priority from Japanese Patent Application No. 2014-174004, filed Aug. 28, 2014, the disclosures of which are incorporated herein in their entireties by reference.

FIELD OF THE INVENTION

The disclosure relates to an etching method.

BACKGROUND OF THE INVENTION

In manufacturing electronic devices, etching is performed to form a hole, a trench or the like in a silicon oxide film, which is an insulating layer. In general, the silicon oxide film is etched by exposing a target object to a plasma of a fluorocarbon gas as disclosed in U.S. Pat. No. 7,708,859.

In the etching using the plasma of the fluorocarbon gas, the silicon oxide film is etched by active species of fluorine. Further, in this etching, a deposit is formed by adhesion of fluorocarbon to the silicon oxide film.

In the above-described etching of the silicon oxide film, a film thickness of the deposit is gradually increased. When the film thickness of the deposit is increased, it becomes difficult that active species which serves to etch the silicon oxide film reach the silicon oxide film. Thus, the etching of the silicon oxide film is stopped in the middle of the processing. As a result, the etching rate of the silicon oxide film deteriorates.

The target object may have a first region of silicon oxide and a second region of silicon nitride. In that case, it is required to selectively etch the first region with respect to the second region of the target object. In the case of using the plasma of the fluorocarbon gas, a thickness of the deposit is greater on the second region than on the first region. Therefore, the etching rate can become higher in the first region than in the second region.

However, at an initial stage of the etching, a deposit is not formed on the second region. Therefore, the second region is etched at the initial stage of the etching.

SUMMARY OF THE INVENTION

In view of the above, it is required to suppress the deterioration of the etching rate in the first region of silicon oxide and improve the etching selectivity of the first region with respect to the second region of silicon nitride.

In accordance with an embodiment, there is provided a method for selectively etching a first region of silicon oxide with respect to a second region of silicon nitride, the method including: a first step of exposing a target object having the first region and the second region to a plasma of a processing gas containing a fluorocarbon gas, etching the first region, and forming a deposit containing fluorocarbon on the first region and the second region; and a second step of etching the first region by a radical of the fluorocarbon contained in the deposit. Further, in the first step, the plasma is generated by a high frequency power supplied in a pulsed manner, and the first step and the second step are repeated alternately.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
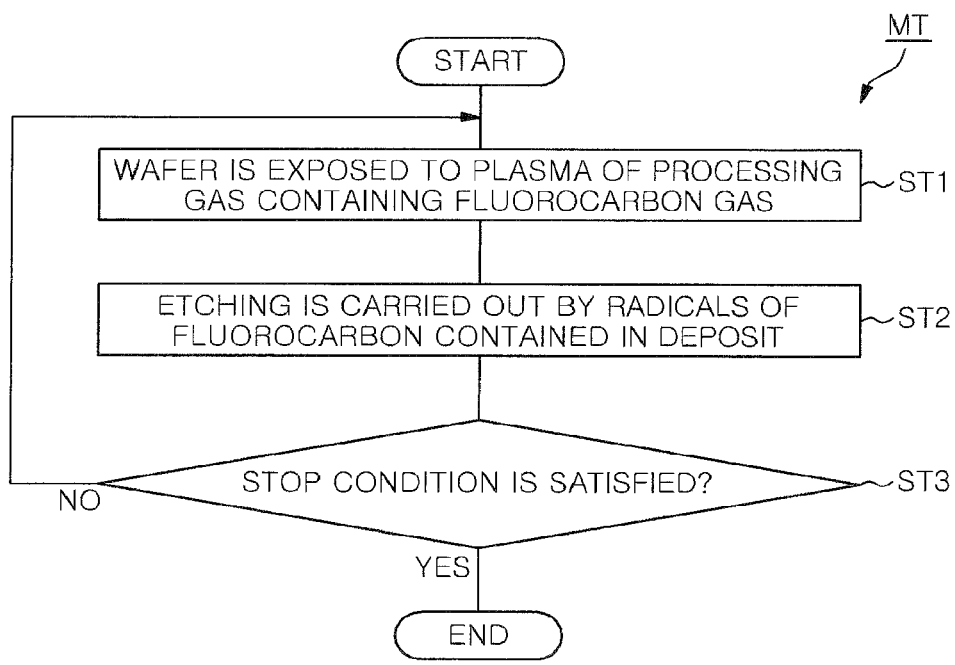
FIG. 1 is a flowchart showing an etching method according to an embodiment.

Hereinafter, embodiments will be described in detail with reference to the accompanying drawings. Further, like reference numerals will be given to the same or corresponding parts in the respective drawings.

FIG. 1 is a flowchart showing an etching method according to an embodiment. A target object (hereinafter, may by referred to as "wafer") of a method MT shown in FIG. 1 is a wafer having a first region of silicon oxide and a second region of silicon nitride. In the method MT shown in FIG. 1, a step ST1 and a step ST2 are alternately performed on the wafer W to thereby selectively etch the first region with respect to the second region.

Figure 2:
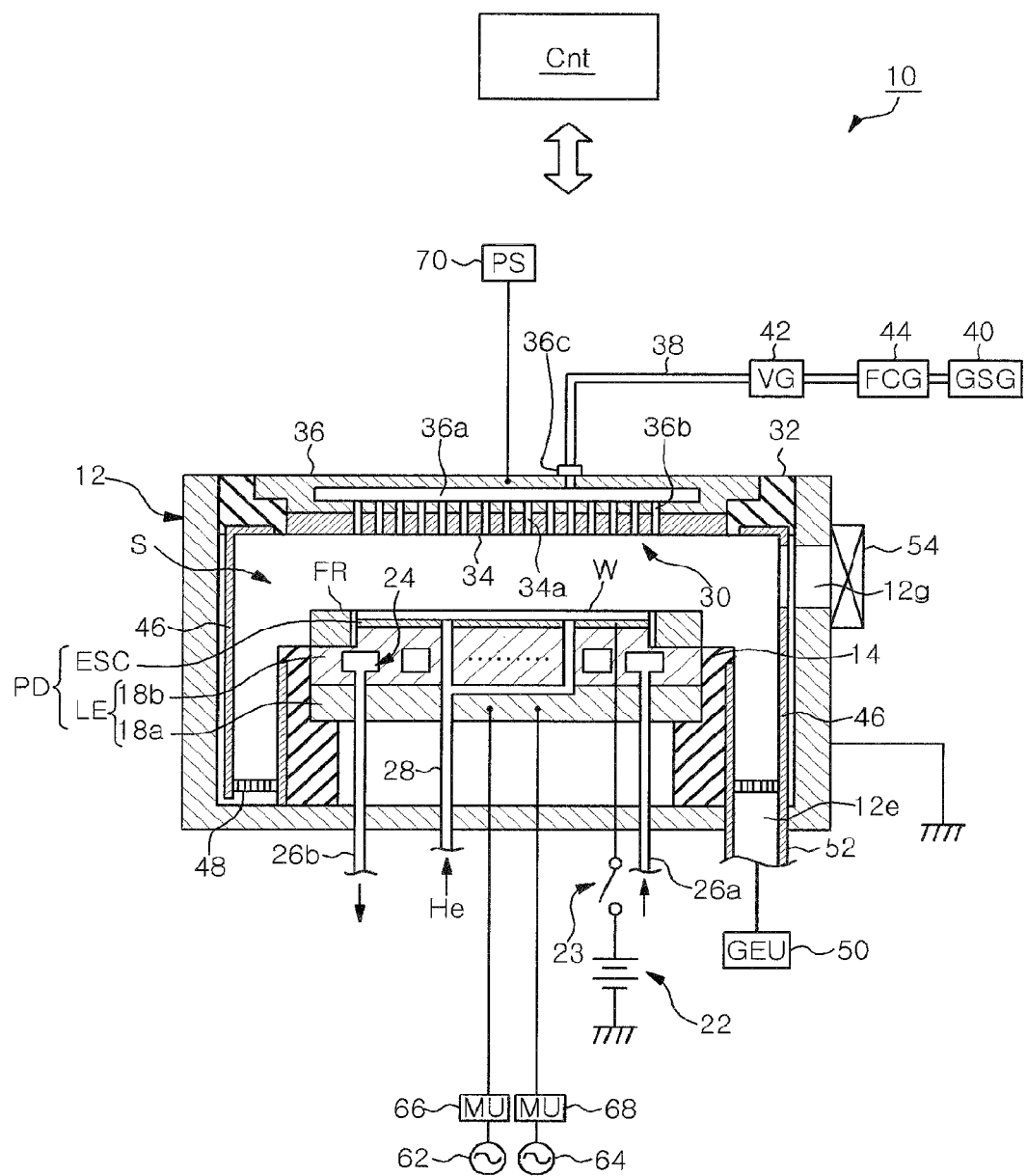
FIG. 2 shows a plasma processing apparatus according to the embodiment.

Prior to detailed description of the method MT shown in FIG. 1, a plasma processing apparatus that can be used for performing the method MT will be described. FIG. 2 shows the plasma processing apparatus according to the embodiment. The plasma processing apparatus 10 shown in FIG. 2 is a capacitively coupled plasma etching apparatus and includes a substantially cylindrical processing chamber 12. An inner wall surface of the processing chamber 12 is made of, e.g., anodically oxidized aluminum. The processing chamber 12 is frame grounded.

A substantially cylindrical supporting unit 14 is provided at a bottom portion of the processing chamber 12. The supporting unit 14 is made of, e.g., an insulating material. In the processing chamber 12, the supporting unit 14 extends vertically from the bottom portion of the processing chamber 12. A mounting table PD is provided in the processing chamber 12. The mounting table PD is supported by the supporting unit 14.

The wafer W is held on a top surface of the mounting table PD. The mounting table PD includes a lower electrode LE and an electrostatic chuck ESC. The lower electrode LE has a first plate 18a and a second plate 18b. The first plate 18a and the second plate 18b are made of a metal, e.g., aluminum, and have a substantially disc shape. The second plate 18b is provided on the first plate 18a and electrically connected to the first plate 18a.

The electrostatic chuck ESC is provided on the second plate 18b. The electrostatic chuck ESC has a structure in which an electrode made of a conductive film is embedded between two insulating layers or two insulating sheets. A DC power supply 22 is electrically connected to the electrode of the electrostatic chuck ESC via a switch 23. The wafer W is attracted and held on the electrostatic chuck ESC by an electrostatic force such as a Coulomb force generated by a DC voltage applied from the DC power supply 22. Accordingly, the wafer W can be held on the electrostatic chuck ESC.

A focus ring FR is provided on a peripheral portion of the second plate 18b to surround the edge of the wafer W and the electrostatic chuck ESC. The focus ring FR is provided to improve the in-plane uniformity of the etching. The focus ring FR is made of a material that is appropriately selected depending on a material of an etching target film. For example, the focus ring FR may be made of quartz.

A coolant path 24 is provided in the second electrode 18b. The coolant path 24 constitutes a temperature control unit. A coolant is supplied to the coolant path 24 from a chiller unit provided outside the processing chamber 12 through a line 26a. The coolant supplied to the coolant path 24 returns to the chiller unit through a line 26b. The coolant is supplied into and circulated through the coolant path 24. A temperature of the wafer W held on the electrostatic chuck ESC is controlled by controlling a temperature of the coolant.

The plasma processing apparatus 10 further includes a gas supply line 28. The gas supply line 28 supplies a heat transfer gas, e.g., He gas, from a heat transfer gas supply unit to a gap between a top surface of the electrostatic chuck ESC and a backside of the wafer W.

The plasma processing apparatus 10 further includes an upper electrode 30. The upper electrode 30 is provided above the mounting table PD to face the mounting table PD. The lower electrode LE and the upper electrode 30 are approximately parallel to each other. Between the upper electrode 30 and the lower electrode LE, a space S where plasma processing is performed on the wafer W is defined.

The upper electrode 30 is held at an upper portion of the processing chamber 12 through an insulating shield member 32. In the present embodiment, the upper electrode 30 may be configured such that a distance in the vertical direction to the top surface of the mounting table PD, i.e., the wafer mounting surface, can vary. The upper electrode 30 may include an electrode plate 34 and an electrode holder 36. The electrode plate 34 is in contact with the processing space S and has a plurality of gas injection openings 34a. In the present embodiment, the electrode plate 34 is made of silicon.

The electrode holder 36 holds the electrode plate 34 and is detachable. The electrode is made of a conductive material, e.g., aluminum. The electrode holder 36 may have a water cooling structure. A gas diffusion space 36a is provided in the electrode holder 36. A plurality of gas holes 36b communicating with the gas injection openings 34a extends downward from the gas diffusion space 36a. Further, the electrode holder 36 includes a gas inlet port 36c for guiding a processing gas into the gas diffusion space 36a. A gas supply line 38 is connected to the gas inlet port 36c.

A gas source group (GSG) 40 is connected to the gas supply line 38 through a valve group (VG) 42 and a flow rate controller group (FCG) 44. The gas source group 40 includes a plurality of gas sources such as a source of a fluorocarbon gas, a source of a rare gas, a source of oxygen ($O_2$) gas, and the like. The fluorocarbon gas contains, e.g., at least one of $C_4F_6$ gas and $C_4F_8$ gas. The rare gas contains at least one among various rare gases such as Ar gas, He gas and the like.

The valve group 42 includes a plurality of valves. The flow rate controller group 44 includes a plurality of flow rate controllers such as a mass flow controller or the like. The gas sources of the gas source group 40 are connected to the gas supply line 38 via the corresponding valves of the valve group 42 and the corresponding flow rate controllers of the flow rate controller group 44.

In the plasma processing apparatus 10, a detachable deposition shield 46 is provided along the inner wall of the processing chamber 12. The deposition shield 46 is also provided at an outer periphery of the supporting unit 14. The deposition shield 46 prevents an etching by-product (deposit) from adhering to the processing chamber 12. The deposition shield 46 may be made of aluminum coated with ceramic such as $Y_2O_3$ or the like.

A gas exhaust plate 48 is provided at the bottom portion side of the processing chamber 12 and between the supporting unit 14 and the inner wall of the processing chamber 12. The gas exhaust plate 48 may be formed by coating aluminum with ceramic, e.g., $Y_2O_3$ or the like. A gas exhaust port 12e is provided below the gas exhaust plate 48 in the processing chamber 12. A gas exhaust unit (GEU) 50 is connected to the gas exhaust port 12e through a gas exhaust line 52. The gas exhaust unit 50 has a vacuum pump such as a turbo molecular pump or the like, so that a pressure in the space in the processing chamber 12 can be decreased to a predetermined vacuum level. A loading/unloading port 12g for the wafer W is provided at the sidewall of the processing chamber 12. The loading/unloading port 12g can be opened and closed by a gate valve 54.

The plasma processing apparatus 10 may further include a first high frequency power supply 62 and a second high frequency power supply 64. The first high frequency power supply 62 generates a high frequency power for plasma generation which has a frequency of 27 MHz to 100 MHz, e.g., 40 MHz. The first high frequency power supply 62 is connected to the lower electrode LE via a matching unit (MU) 66. The matching unit 66 is a circuit for matching an output impedance of the first high frequency power supply 62 with an input impedance of a load side (the lower electrode LE side).

The first high frequency power supply 62 can supply the high frequency power to the lower electrode LE continuously. Further, the first high frequency power supply 62 can supply the high frequency power to the lower electrode LE in a pulsed manner. In other words, the first high frequency power supply 62 can supply a high frequency power of a first level and a high frequency power of a second level lower than the first level to the lower electrode LE alternately. For example, the high frequency power of the second level may be a high frequency power having a power level of zero. In that case, the first high frequency power supply 62 can supply the high frequency power while switching an ON state and an OFF state thereof alternately. The first level and the second level may be alternately switched at a frequency ranging from 2 kHz to 40 kHz. A duty ratio, i.e., a ratio of the first level period of the high frequency power to one cycle including the first level period and the second level period of the high frequency power, may range from 20% to 80%.

The second high frequency power supply 64 generates a high frequency bias power for attracting ions to the wafer W which has a frequency of 400 kHz to 13.56 MHz, e.g., 3 MHz. The second high frequency power supply 64 is connected to the lower electrode LE via a matching unit 68. The matching unit 68 is a circuit for matching an output impedance of the second high frequency power supply 64 with an input impedance of the load side (the lower electrode LE side).

The second high frequency power supply 64 can supply a high frequency bias power to the lower electrode LE in a continuous manner. Further, the second high frequency power supply 64 can supply the high frequency bias power to the lower electrode LE in a pulsed manner. In other words, the second high frequency power supply 64 can supply the high frequency bias power of a first level and the high frequency bias power of a second level lower than the first level to the lower electrode LE alternately. For example, the high frequency bias power of the second level may be a high frequency bias power having a power level of zero. In that case, the second high frequency power supply 64 can supply the high frequency bias power while switching an ON state and an OFF state thereof alternately. The first level and the second level may be switched at a frequency ranging from 2 kHz to 40 kHz. A duty ratio, i.e., a ratio of the first level period of the high frequency bias power to one cycle including the first level period and the second level period of the high frequency bias power, may range from 20% to 80%. The first level of the high frequency bias power may be different from the first level of the high frequency power.

The plasma processing apparatus 10 further includes a power supply (PS) 70. The power supply 70 is connected to the upper electrode 30. The power supply 70 applies to the upper electrode 30 a voltage for attracting positive ions in the processing space S to the electrode plate 34. In this example, the power supply 70 is a DC power supply for generating a negative DC voltage. In another example, the power supply 70 may be an AC power supply for generating an AC voltage having a relatively low frequency. The voltage applied from the power supply 70 to the upper electrode may be about −150V or less. In other words, the voltage applied to the upper electrode 30 from the power supply 70 may be a negative voltage having an absolute value of about 150V or above. When such a voltage is applied to the upper electrode 30 from the power supply 70, positive ions in the processing space S collide with the electrode plate 34. As a consequence, secondary electrons and/or silicon are sputtered from the electrode plate 34. The sputtered silicon is coupled with active species of fluorine existing in the processing space S, thereby reducing the amount of active species of fluorine.

In the present embodiment, the plasma processing apparatus 10 may further include a control unit Cnt. The control unit Cnt is a computer including a processor, a storage unit, an input device, a display device and the like. The control unit Cnt controls the respective components of the plasma processing apparatus 10. The control unit Cnt can allow an operator to input commands to manage the plasma processing apparatus 10 by using the input device and display the operation state of the plasma processing apparatus 10 on the display device. The storage unit of the control unit Cnt stores therein a control program for controlling various processes performed in the plasma processing apparatus 10, and a program, i.e., a processing recipe, for performing processes of the respective components of the plasma processing apparatus 10 based on the processing conditions.

Figure 3A:
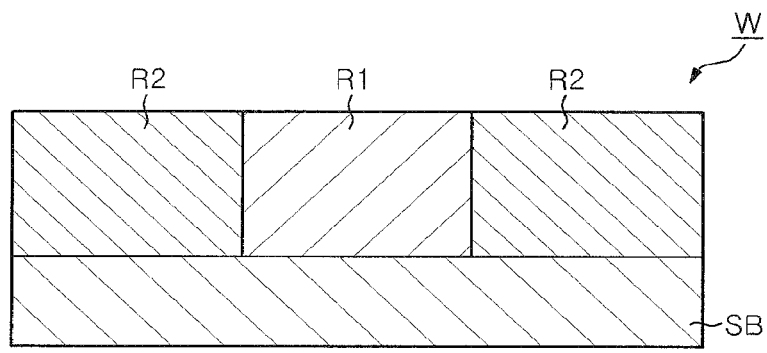
FIGS. 3A to 3C are cross sectional views showing states of a target object before and after each step of the method shown in FIG. 1.
Figure 3B:
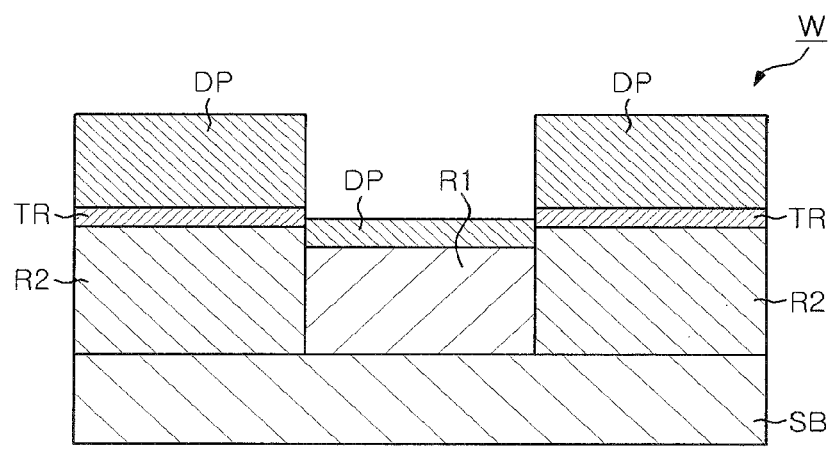
Figure 3C:
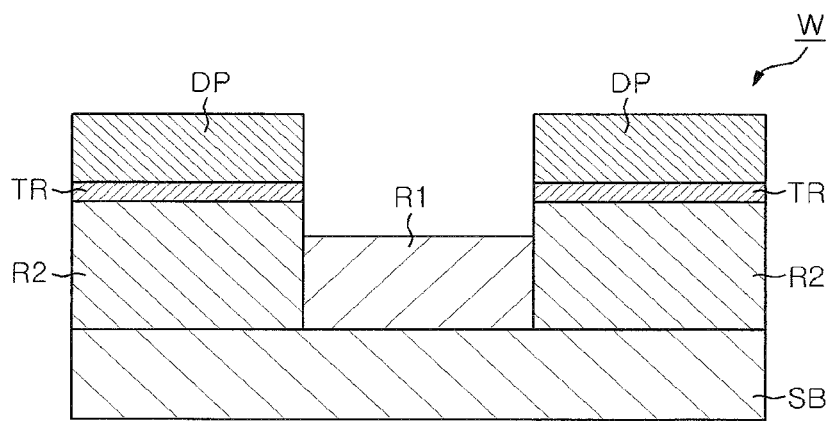
Figure 4:
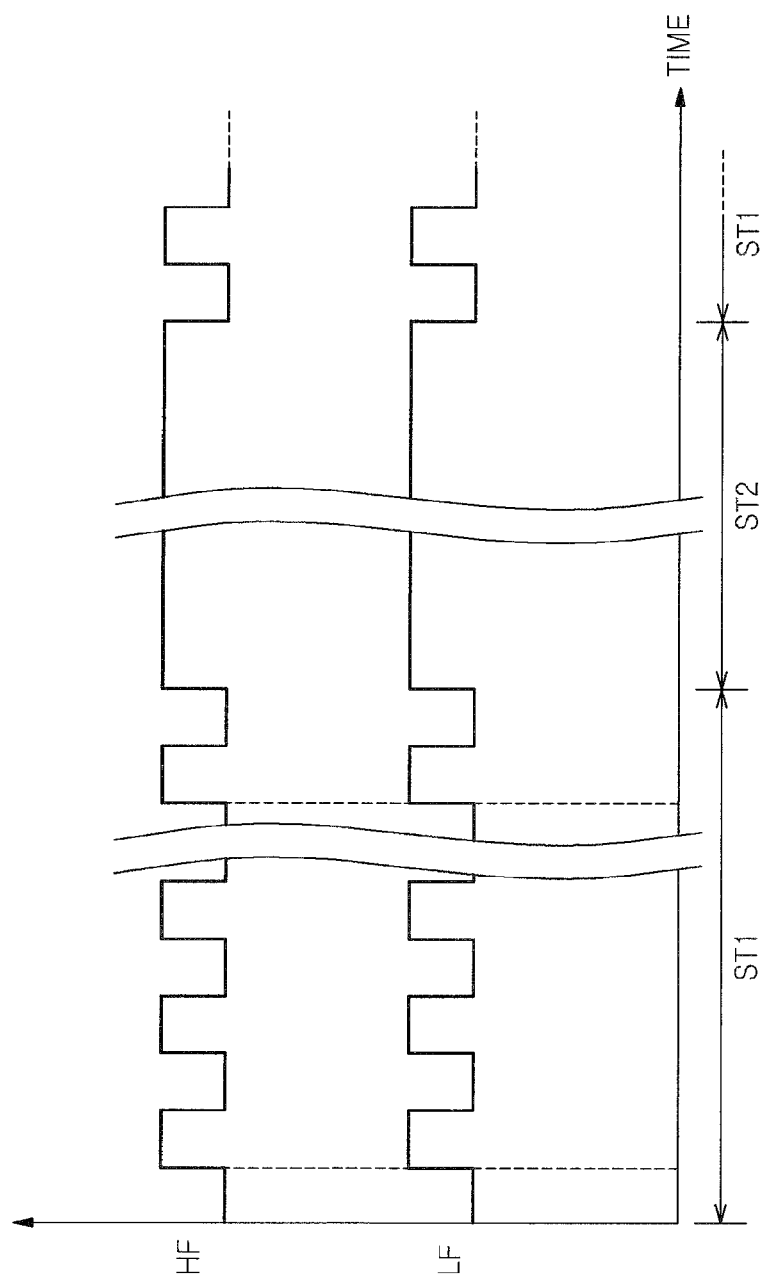
FIG. 4 shows a waveform of a high frequency power and a waveform of a high frequency bias power in a step ST1.

Referring back to FIG. 1, the method MT will be described in detail. In the following description, FIGS. 3A to 3C and 4 will be referred to in addition to FIG. 1. FIGS. 3A to 3C are cross sectional views showing states of the target object before and after each step of the method shown in FIG. 1. FIG. 4 shows a waveform of the high frequency power and a waveform of the high frequency bias power in the step ST1.

The method MT shown in FIG. 1 can be applied to a wafer W shown in FIG. 3A. The wafer W shown in FIG. 3 has a substrate SB, a first region R1 and a second region R2. The first region R1 and the second region R2 are disposed on the substrate SB. The first region R1 is made of silicon oxide and the second region R2 is made of silicon nitride. Surfaces of the first region R1 and the second region R2 are exposed simultaneously before the application of the method MT or in the middle of the implementation of the method MT.

First, a step ST1 (first step) of the method MT1 is executed. In the step ST1, the wafer W is exposed to a plasma of a processing gas containing a fluorocarbon gas. The fluorocarbon gas contains, e.g., at least either one of $C_4F_6$ gas and $C_4F_8$ gas. The processing gas may contain at least one rare gas among various rare gases such as Ar gas, He gas and the like. The processing gas may contain oxygen ($O_2$) gas. The processing gas is excited by a high frequency electric field generated by supplying a high frequency power HF for plasma generation. In the step ST1, the plasma is generated by exciting the processing gas and the wafer W is exposed to the plasma thus generated.

As shown in FIG. 4, in the step ST1, the high frequency power HF is supplied in a pulsed manner in order to generate a plasma of the processing gas. In FIG. 4, the high level period of the high frequency power HF is the first level period of the high frequency power HF and the low level period of the high frequency power HF is the second level period of the high frequency power HF. In the step ST1, the first level and the second level are switched alternately at the frequency ranging from 2 kHz to 40 kHz. The duty ratio may range from 20% to 80%. By setting the duty ratio to a level higher than or equal to 20%, the plasma can be maintained. Further, by setting the duty ratio to a level lower than or equal to 80%, the etching of the second region R2 can be more effectively suppressed.

In the step ST1, the high frequency bias power LF for attracting ions in the plasma to the wafer W may be supplied in a continuous manner. In the step ST1 of the present embodiment, the high frequency bias power LF may be supplied in a pulsed manner. In FIG. 4, the high level period of the high frequency bias power LF is the first level period of the high frequency bias power LF and the low level period of the high frequency bias power LF is the second level period of the high frequency bias power LF. In the step ST1, the first level and the second level are switched alternately at the frequency ranging from 2 kHz to 40 kHz. The duty ratio may range from 20% to 80%. In the step ST1, the high frequency bias power LF may be or may not be synchronized with the high frequency power HF.

In the case of executing the step ST1 by using the plasma processing apparatus 10, the processing gas is supplied from the gas source group 40 into the processing chamber 12. In the step ST1, the high frequency power is supplied from the first high frequency power supply 62 to the lower electrode LE in a pulsed manner. In the step ST1, the high frequency bias power can be supplied from the second high frequency power supply 64 to the lower electrode LE in a continuous manner or in a pulsed manner. In the step ST1, a pressure in the space in the processing chamber 12 is set to a predetermined level by the gas exhaust unit 50. For example, the pressure in the space in the processing chamber 12 is set to a range from 20 mTorr (2.666 Pa) to 50 mTorr (6.666 Pa). Accordingly, a plasma of a processing gas is generated in the processing chamber 12, and the wafer W mounted on the mounting table PD is exposed to the plasma thus generated. In the step ST1, a negative DC voltage may be applied to the upper electrode 30 from the power supply 70. The voltage applied to the upper electrode 30 from the power supply 70 may be −150V or less. In other words, the voltage applied to the upper electrode 30 from the power supply 70 may be a negative voltage having an absolute value of about 150V or above. The operations of the respective components of the plasma processing apparatus 10 in the step ST1 can be controlled by the control unit Cnt.

In an initial stage of the step ST1, active species of atoms and/or molecules derived from fluorocarbon, e.g., active species of fluorine and/or fluorocarbon, collide with the first region R1 of the wafer W in a state shown in FIG. 3A. As a consequence, the first region R1 is etched in the step ST1. Further, in the step ST1, a deposit containing fluorocarbon is adhered to the first region R1. As a consequence, a deposit DP containing fluorocarbon is formed on the first region R1, as shown in FIG. 3B. A film thickness of the deposit DP is increased as the execution time of the step ST1 is increased.

In the initial stage of the step ST1, active species of atoms and/or molecules derived from fluorocarbon, e.g., active species of fluorine and/or fluorocarbon, also collide with the second region R1 of the wafer W in the state shown in FIG. 3A. When such active species collide with the second region R2, the fluorocarbon deposit may be transformed to form a protective film TR containing a high concentration of carbon on the surfaces of the second region R2 as shown in FIG. 3B. The protective film TR contains silicon and nitrogen forming the second region R2, and atoms and/or molecules contained in the processing gas. For example, the protective film TR may contain carbon, fluorine and oxygen contained in the processing gas, in addition to silicon and nitrogen. Further, in the step ST1, the deposit DP is formed on the protective film TR, as shown in FIG. 3B.

When a voltage is applied to the upper electrode 30 from the power supply 70 in the step ST1, positive ions in the processing space S collide with the electrode plate 34. Accordingly, silicon is sputtered from the electrode plate 34. The sputtered silicon is coupled with active species of fluorine, e.g., fluorine radicals and fluorine ions, existing in the processing space S, thereby reducing the amount of active species of fluorine. As a consequence, the formation speed of the protective film TR containing a large amount of carbon is increased, which suppresses the etching of the second region R2 by the active species of fluorine. Meanwhile, the first region R1 is etched by active species of fluorocarbon in the plasma. Further, the deposit DP of fluorocarbon is formed on the first region R1 by the active species of fluorocarbon.

In the step ST1, the high frequency power HF is supplied in a pulsed manner as described above. When the high frequency power HF is supplied in the pulsed manner, a radical flux is attenuated at a lower rate compared to an ion flux during a pulse off period. Since there exists a period in which only radicals are irradiated, the ratio of the ion flux is decreased with respect to the radical flux. In other words, radicals are generated more than ions. Accordingly, the etching of the second region R2 that is not covered with the deposit DP is suppressed.

When the film thickness of the deposit DP formed on the first region R1 is increased by the processing of the step ST1, the deposit DP prevents the active species that can etch the first region R1 from reaching the first region R1. Therefore, when the step ST1 is executed continuously, the etching of the first region R1 is stopped. Therefore, in order to continue the etching process, a step ST2 (second step) of the method MT is executed.

In the step ST2, the first region R1 is etched by radicals of fluorocarbon contained in the deposit DP. In the step ST2 of the present embodiment, the wafer W that has been processed in the step ST1 is exposed to a plasma of a rare gas. In the step ST2, both of the high frequency power HF and the high frequency bias power LF are supplied in a continuous manner as shown in FIG. 4. The processing time of the step ST2 and the processing time of the step ST1 can be arbitrarily set. In the present embodiment, the ratio of the processing time of the step ST2 to the entire processing time of the steps ST1 and ST2 may be set to a range from 30% to 70%.

In the case of executing the step ST2 by using the plasma processing apparatus 10, a rare gas is supplied from the gas source group 40. In the step ST2, oxygen gas ($O_2$ gas) may be supplied in addition to the rare gas, or nooxygen gas may be supplied. In the step ST2, the high frequency power is supplied from the first high frequency power supply 62 to the lower electrode LE in a continuous manner. Further, in the step ST2, the high frequency bias power can be supplied from the second high frequency power supply 64 to the lower electrode LE in a continuous manner. In the step ST2, a pressure in the space in the processing chamber 12 is set to a predetermined level by the gas exhaust unit 50. For example, the pressure in the space in the processing chamber 12 is set to a range from 20 mTorr (2.666 Pa) to 50 mTorr (6.666 Pa). Accordingly, a plasma of the rare gas is generated in the processing chamber 12, and the wafer W mounted on the mounting table PD is exposed to the plasma thus generated. Further, in the step ST2, a negative DC voltage may be applied to the upper electrode 30 from the power supply 70. The voltage applied to the upper electrode 30 from the power supply 70 may be a voltage of about −150V or less. In other words, the voltage applied to the upper electrode 30 from the power supply 70 may be a negative voltage having an absolute value of about 150V or above. The operations of the respective components of the plasma processing apparatus 10 in the step ST2 can be controlled by the control unit Cnt.

In the step ST2, active species of rare gas atoms, e.g., ions of rare gas atoms, collide with the deposit DP. Accordingly, fluorocarbon radicals in the deposit DP promote the etching of the first region R1. Further, the film thickness of the deposit DP on the first region R1 is decreased during the step ST2. In the step ST2, the film thickness of the deposit DP on the second region R2 is also decreased. Since, however, the protective film TR exists on the second region R2, the etching of the second region R2 is suppressed. As a result of the execution of the step ST2, the wafer W has a state shown in FIG. 3C.

When the voltage is applied from the power supply 70 to the upper electrode 30 in the step ST2, positive ions in the processing space S collide with the electrode plate 34. Accordingly, silicon is sputtered from the electrode plate 34. During the execution of the step ST2, the active species of fluorine generated in the step ST1 may remain in the processing chamber 12 without being removed. The silicon sputtered from the electrode plate 34 is coupled with the active species of fluorine existing in the processing space S, thereby reducing the amount of the active species of fluorine. Accordingly, the etching of the second region R2 by the active species of fluorine is suppressed. Meanwhile, the first region R1 is etched by radicals of fluorocarbon in the deposit DP.

When no oxygen gas is supplied in the step ST2, the first region R1 may be further etched selectively with respect to the second region R2.

In the method MT, the step ST1 is executed again after the step ST2 is executed. Since the film thickness of the deposit DP is decreased by the execution of the step ST2, the first region R1 can be further etched when the wafer W is exposed to the plasma of the processing gas by executing the step ST1 again. Thereafter, the step ST2 is executed again, so that the first region R1 can be etched by the fluorocarbon radicals in the deposit DP.

In the method MT, it is determined in the step ST3 whether or not a stop condition is satisfied. For example, it is determined that the stop condition is satisfied when the number of repetition of the cycle including the steps ST1 and ST2 reaches a predetermined number. When the stop condition is not satisfied, the cycle including the steps ST1 and ST2 is executed again. When the stop condition is satisfied, the method MT is completed.

In the above-described method MT, the etching stop of the first region R1 can be prevented by executing the steps ST1 and ST2 alternately multiple time. As a result, the etching of the first region R1 can be continued. Further, in the method MT, the first region R1 can be selectively etched with respect to the second region R2. Especially in the method MT, the high frequency power HF is supplied in a pulsed manner in the step ST1, so that the etching of the second region R2 that is not covered with the deposit DP is suppressed. Therefore, the etching selectivity of the first region R1 with respect to the second region R2 can be improved.

Figure 5:
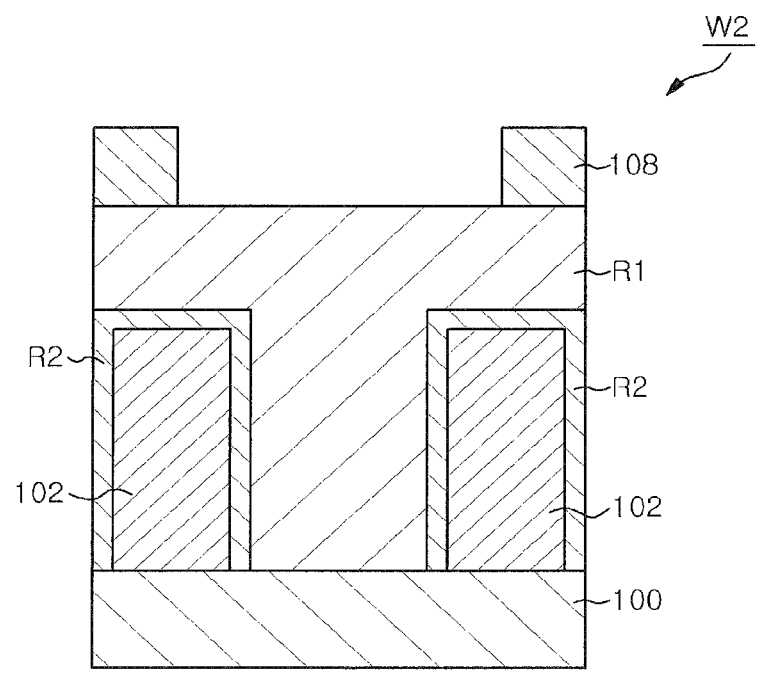
FIG. 5 is a cross sectional view showing another example of the target object of the method shown in FIG. 1.

FIG. 5 is a cross sectional view showing another example of the target object of the method shown in FIG. 1. In FIG. 5, a wafer W2 having a first region R1 and a second region R2 is shown, and the method MT can be applied to the wafer W2. Specifically, the wafer W2 includes a base layer 100, a plurality of protruding regions 102, a first region R1, a second region R2, and a mask 108. The wafer W2 may be a product obtained during manufacturing of, e.g., a fin field effect transistor.

The base layer 100 may be made of, e.g., poly-crystalline silicon. In this example, the base layer is a fin region and has a substantially cuboidal shape. The protruding regions 102 are provided on the base layer 100 and arranged substantially in parallel. The protruding regions 102 may be, e.g., a gate region. The second region R2 is made of silicon nitride and covers each of the protruding regions 102. The protruding regions 102 are buried in the first region R1. In other words, the first region R1 covers the protruding regions 102 with the second region R2 therebetween. The first region R1 is made of silicon oxide. A mask 108 is provided on the first region R1. The mask 108 has a pattern with openings at positions corresponding to gaps between the adjacent protruding regions 102. The mask 108 is made of an organic film. Further, the mask 108 can be fabricated by photolithography.

By applying the method MT to the wafer W2, the first region R1 of the wafer W2 can be selectively etched with respect to the second region R2 and, thus, holes can be formed between the adjacent protruding regions 102 in a self-aligned manner. Especially, when the second region R2 is exposed as the etching progresses, the deposit DP is not formed on the second region R2. However, by supplying the high frequency power HF in a pulsed manner in the step ST1, the etching of the second region R2 that is not covered by the deposit DP can be suppressed. Further, the etching of the first region R1 can be continued without being stopped. The holes formed by the method MT extend to the surface of the base layer 100 while penetrating through regions between the protruding regions 102 adjacent to each other. Such holes may be, e.g., a contact hole connected to a source or a drain of the fin region.

Hereinafter, a test example that has been executed to evaluate the method MT will be described. The test example to be described below is only an example and the disclosure is not limited thereto.

In the test example, the method MT using the plasma processing apparatus 10 was applied to a wafer having a first region R1 and a second region R2. In the test example, the execution number of cycles, each including the steps ST1 and ST2, i.e., the number of cycles, was varied.

Hereinafter, the processing condition of the test example will be described.

(Processing Condition of the Test Example)
<Step ST1>
High frequency power HF: frequency of 40 MHz, 500 W
High frequency bias power LF: frequency of 3 MHZ, 50 W
DC voltage of the power supply 70: −300V
Frequencies of the high frequency power HF and the high frequency bias power LF supplied in a pulsed manner: 20 kHz
Duty ratios of the high frequency power HF and the high frequency bias power LF supplied in a pulsed manner: 60%
Processing gas
 $C_4F_6$ gas: 32 sccm
 Ar gas: 1500 sccm
 $O_2$ gas: 20 sccm
Execution time of the step ST1 in one cycle: 1 sec
<Step ST2>
High frequency power HF: frequency of 40 MHz, 500 W
High frequency bias power LF: frequency of 3 MHz, 50 W
DC voltage of the power supply 70: −300V
The high frequency power HF and the high frequency bias power LF being supplied in a continuous manner
Processing gas
 $C_4F_6$ gas: 0 sccm
 Ar gas: 1500 sccm
 $O_2$ gas: 0 sccm
Execution time of the step ST2 in one cycle: 5 sec For reference, comparative examples 1 to 3 were performed. In the comparative example 1, a method including steps STa and STb was applied to a wafer same as the wafer of the test example while varying the execution number of cycles, each including the steps STa and STb. The step STa was different from the step ST1 of the test example except that both of the high frequency power HF and the high frequency bias power LF are supplied in a continuous manner. The step STb was the same as the step ST2 of the test example. In other words, in the comparative example 1, the high frequency power HF and the high frequency bias power LF were supplied in a continuous manner in both of the steps STa and STb.

In the comparative example 2, a method including steps STc and STd was applied to a wafer same as the wafer of the test example while varying the number of execution of the cycle including the steps STc and STd. The step STc was the same as the step ST1 of the test example. The step STd was different from the step ST2 of the test example except that both of the high frequency power HF and the high frequency bias power LF were supplied in a pulsed manner. In other words, in the comparative example 2, the high frequency power HF and the high frequency bias power LF were supplied in a pulsed manner in both of the steps STc and STd.

In the comparative example 3, a processing condition same as that of the comparative example 1 except that the execution time of the step STa was set to 1.5 sec was applied to a wafer same as that of the test example.

Figure 6:
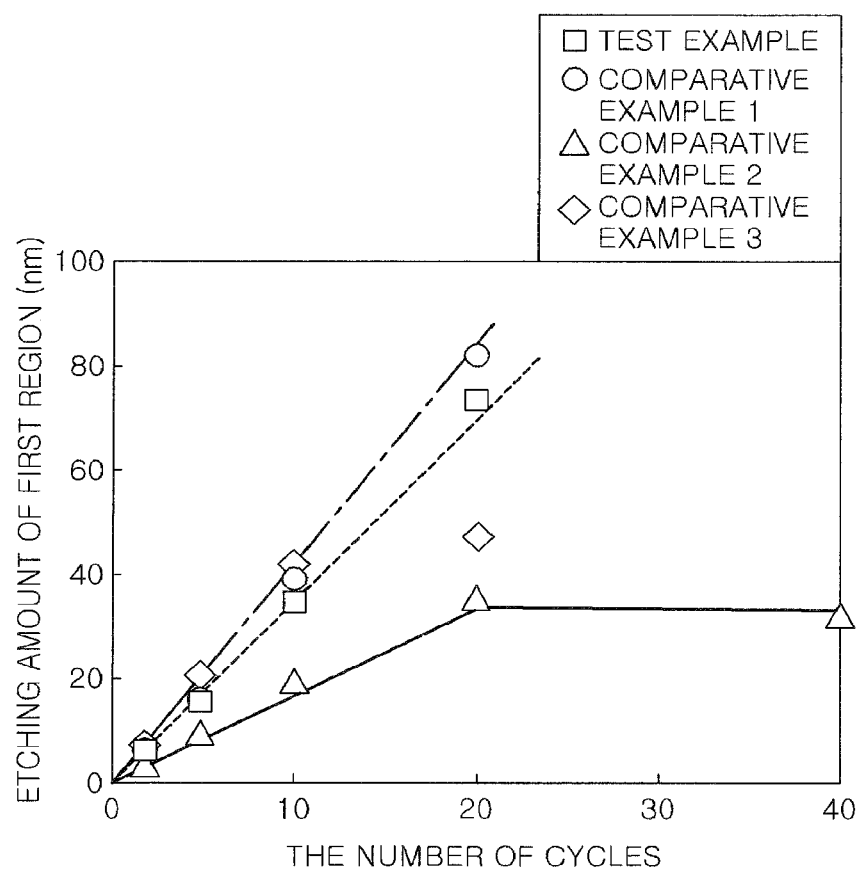
FIGS. 6 and 7 show test results.
Figure 7:
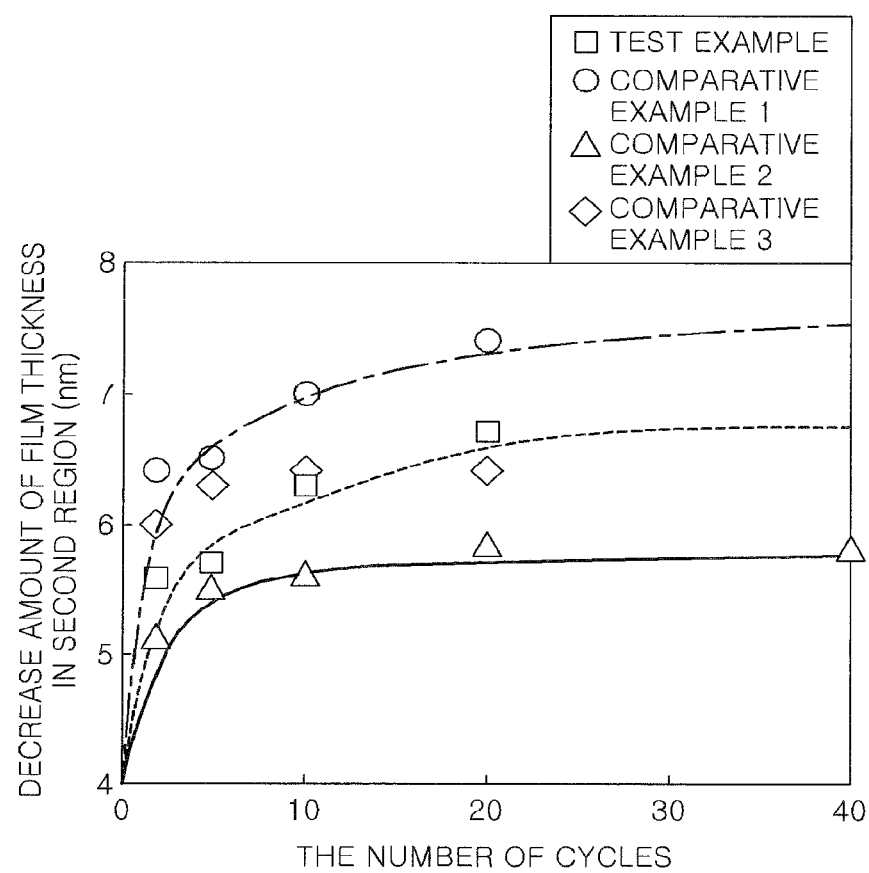

After the methods of the test example and the comparative examples 1 to 3 were respectively applied to the wafers, there were measured the etching amount of the first region R1, i.e., the decrease amount of the film thickness in the first region R1 of each wafer, and the decrease amount of the film thickness in the second region R2 of each wafer. FIGS. 6 and 7 show test results. The horizontal axis in FIG. 6 represents the number of cycles and the vertical axis in FIG. 6 represents the etching amount of the first region. The horizontal axis in FIG. 7 denotes the number of cycles and the vertical axis in FIG. 7 represents the decrease amount of the film thickness in the second region.

In the test example, i.e., in the case of employing the method MT for supplying the high frequency power HF in a pulsed manner only in the step ST1, the etching amount of the first region was kept greater than those of the comparative examples 2 and 3, as can be seen from FIG. 6. In other words, the etching amount of the first region in the test example was substantially equal to that in the comparative example 1. As shown in FIG. 7, the decrease amount of the film thickness in the second region in the test example can be considerably reduced compared to that in the comparative example 1. Therefore, from the test results, it has been found that the deterioration of the etching rate in the first region can be suppressed and the etching selectivity of the first region with respect to the second region can be improved.

While the disclosure has been shown and described with respect to the embodiments, it will be understood by those skilled in the art that various changes and modifications may be made without departing from the scope of the disclosure as defined in the following claims.

What is claimed is:

1. A method for selectively etching a first region of a first silicon-containing material with respect to a second region of a second material different from the first silicon-containing material, the method comprising:
    a first step of exposing a target object having the first region and the second region to a plasma of a processing gas containing a fluorocarbon gas, etching the first region, and forming a deposit containing fluorocarbon on the first region and the second region; and
    a second step of etching the first region by a radical of the fluorocarbon contained in the deposit,
    wherein in the first step, the plasma is generated by a high frequency power supplied in a pulsed manner,
    wherein the first step and the second step are repeated alternately, and
    wherein an etching rate of the first silicon-containing material for the processing gas is higher than an etching rate of the second material for the processing gas.

2. The method of claim 1, wherein in the first step, a high frequency bias power for attracting ions to the target object is supplied in a pulsed manner.

3. The method of claim 2, wherein the high frequency bias power and the high frequency power are synchronized with each other.

4. The method of claim 1, wherein in the second step, a plasma of a rare gas is generated by a high frequency power supplied in a continuous manner.

5. The method of claim 2, wherein in the second step, a plasma of a rare gas is generated by a high frequency power supplied in a continuous manner.

6. The method of claim 3, wherein in the second step, a plasma of a rare gas is generated by a high frequency power supplied in a continuous manner.

7. The method of claim 1, wherein a duty ratio of the high frequency power is equal to or greater than 20% and equal to or smaller than 80%.

8. The method of claim 2, wherein a duty ratio of the high frequency power is equal to or greater than 20% and equal to or smaller than 80%.

9. The method of claim 1, wherein a ratio of a processing time of the first step to a sum of the processing time of the first step and a processing time of the second step is equal to or greater than 30% and equal to or smaller than 70%.

10. The method of claim 1, wherein in the first step, a protective film containing carbon and silicon is formed on the second region.

11. The method of claim 10, wherein in the first step, the deposit containing fluorocarbon is formed on the protective film.

12. The method of claim 1, wherein in the first step, the etching the first region and the forming the deposit containing fluorocarbon on the first region occur simultaneously.

13. The method of claim 1, wherein the target object is accommodated in a plasma processing apparatus including an upper electrode, and
    wherein in the first step, a DC voltage is applied to the upper electrode.

14. The method of claim 1, wherein the target object is held on a lower electrode of a plasma processing apparatus, and
    wherein the high frequency power is supplied to the lower electrode.

15. The method of claim 1, wherein the processing gas further contains an oxygen gas.

16. The method of claim 1, wherein in the second step, an oxygen gas is supplied.

* * * * *